United States Patent
Shannon et al.

(10) Patent No.: US 6,667,577 B2
(45) Date of Patent: Dec. 23, 2003

(54) PLASMA REACTOR WITH SPOKE ANTENNA HAVING A VHF MODE WITH THE SPOKES IN PHASE

(75) Inventors: Steven Shannon, San Mateo, CA (US); Daniel Hoffman, Saratoga, CA (US); Chunshi Cui, San Jose, CA (US); Yan Ye, Saratoga, CA (US); Gerardo Delgadino, Santa Clara, CA (US); Douglas A. Buchberger, Jr., Livermore, CA (US); Shiang-Bau Wang, Hsinchu (TW); Robert B. Hagen, Newark, CA (US); Matthew L Miller, Newark, CA (US); Stephen Thai, Milpitas, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/025,408

(22) Filed: Dec. 18, 2001

(65) Prior Publication Data

US 2003/0111962 A1 Jun. 19, 2003

(51) Int. Cl.$^7$ ................................................. H01J 7/24
(52) U.S. Cl. .............................. 315/111.21; 315/111.81; 118/723 I
(58) Field of Search ........................ 315/111.21, 111.51, 315/111.81; 118/723 I, 723 E; 204/192.1, 298.04; H01J 7/24

(56) References Cited

U.S. PATENT DOCUMENTS

| | | | |
|---|---|---|---|
| 5,565,738 A | 10/1996 | Samukawa et al. ...... | 315/111.51 |
| 5,846,331 A | * 12/1998 | Miyamoto ............... | 118/723 R |
| 5,900,699 A | 5/1999 | Samukawa et al. ...... | 315/111.51 |
| 6,155,202 A | * 12/2000 | Nakano et al. .......... | 118/723 E |
| 6,417,626 B1 | * 7/2002 | Brcka et al. ............. | 315/111.51 |

OTHER PUBLICATIONS

Maeshige, K., Hasebe, M., Yamaguchi, Y., and Makabe, T., "Predictive study of a plasma structure and function in reactive ion etcher driven by a very high frequency: Validity of an extended two–dimensional relaxation continuum model," *Journal of Applied Physcis*, vol. 88, No. 8, pp. 4518–4524, Oct. 15, 2000.

Samukawa, S., Nakagawa, Y., Tsukada, T., Ueyama, H., and Shinohara, K., "Low–temperature, uniform, and high–density plasma produced by a new ultra–high–frequency discharge with a spokewise antenna," *Appl. Phys. Lett.*, vol. 67, No. 10, pp. 1414–1416, Sep. 4, 1995.

Sumiya, S., Mizutani, Y., Yoshida, R., Hori, M., Goto, T., Ito, M., Tsukada, T., and Samukawa, S., "Plasma diagnostics and low–temperature deposition of microcrystalline silicon films in ultrahigh–frequency silane plasma," *Journal of Applied Physics*, vol. 88, No. 1, pp. 576–581, Jul. 1, 2000.

* cited by examiner

*Primary Examiner*—Tho Phan
(74) *Attorney, Agent, or Firm*—Robert M. Wallace; Joseph Bach

(57) ABSTRACT

An RF power applicator of the reactor includes inner and outer conductive radial spokes. The set of inner conductive spokes extends radially outwardly from and is electrically connected to the conductive post toward the conductive side wall. The set of outer conductive spokes extends radially inwardly toward the conductive post from and is electrically connected to the conductive side wall. In this way, the inner and outer sets of conductive spokes are electrically connected together, the combination of the inner and outer set of spokes with the conductive enclosure having a fundamental resonant frequency inversely proportional to the height of the conductive enclosure and the lengths of the inner and outer set of conductive spokes. An RF source power generator is coupled across the RF power applicator and has an RF frequency corresponding to the fundamental resonant frequency.

59 Claims, 13 Drawing Sheets

PLASMA REACTOR WITH SPOKE ANTENNA HAVING A VHF MODE WITH THE SPOKES IN PHASE

BACKGROUND OF THE INVENTION

The invention concerns a plasma reactor for processing a semiconductor wafer or workpiece and in particular for etching high aspect ratio openings through a thin film structure on the wafer. In such processes, the higher the aspect ratio of the opening to be etched (i.e., the smaller the opening diameter and the deeper the opening depth), the greater the etch selectivity that is required. Typically, the opening is defined by a photoresist layer, and the etch selectivity is a measure of the etch rate of the thin film material to be etched versus the etch rate of the photoresist. There are two seemingly conflicting needs for such a process. One need is to improve the overall etch rate of the process to increase throughput or productivity. The other need is to improve selectivity in order to be able to form higher aspect ratio openings (smaller diameter, deeper depth) in order to fabricate smaller or finer semiconductor structures. That these two needs apparently conflict may be seen from the following. Processes that exhibit high etch selectivity (and are therefore capable of etching high aspect ratio openings) typically involve capacitively coupled plasmas. Unfortunately, such plasmas are incapable of providing a high ion density and therefore exhibit a low etch rate. On the other hand, processes that exhibit a high ion density (and are therefore capable of etching at high etch rates) typically involve inductively coupled plasmas. Unfortunately, such plasmas tend to form the most highly reactive species at higher power level or higher plasma density and therefore are incapable of achieving high etch selectivity. This problem worsens as the plasma source power and ion density increases.

Such problems are particularly acute when etching silicon dioxide films or oxygen-containing films that overlie silicon or non-oxygen containing films, when using fluorine as the principal etchant, for example. Fluorine etches silicon faster than silicon dioxide, and so special measures must be taken in order to etch a silicon dioxide film without etching an underlying silicon film. Such special measures involve the use of fluoro-carbon or fluoro-hydrocarbon process gases. The gases dissociate in the plasma to form fluorine-containing etchant species and carbon-containing polymer precursor species. The polymer precursor species accumulate as a protective coating on any exposed silicon surfaces but not on silicon dioxide surfaces, thus enhancing etch selectivity. The low selectivity of typical inductively coupled plasmas is attributable to the tendency of such plasmas to at least nearly completely dissociate the process gases into their most fundamental components, such as free fluorine. Free fluorine is highly reactive and tends to etch both silicon dioxide as well as non-oxygen containing materials (such as polymer and photoresist), so that little or no etch selectivity is possible with such an etchant. In contrast, the high etch selectivity of capacitively coupled plasmas is due to their tendency to effect only limited dissociation of the process gases (thus producing very little or no free fluorine), so that the etchant species are more complex fluoro-carbon species that tend not to attack polymer and photoresist.

The dissociation behavior of inductively coupled plasmas and capacitively coupled plasmas is experimentally confirmed using optical emission spectroscopy (OES) measurements. Such OES measurements taken in capacitively coupled plasmas indicate a large population of complex fluorocarbon species, in other words ions or radicals consisting of a number of carbon and fluorine atoms, and a small population of simple fluorocarbon species or free fluorine and free carbon. OES measurements taken in inductively coupled plasmas indicate an opposite distribution of species, namely a large population of simple fluorocarbon species and free fluorine and a smaller population of the more desirable complex fluorocarbon species. This phenomenon is associated with undesirable elevations in the electron energy distribution high energy tail.

An inductively coupled plasma is maintained using an antenna having a large inductance, such as a coil antenna. Various types of antennas for maintaining capacitively coupled plasmas are known, each of which has a large capacitance, and these typically consist of a pair of electrodes. Usually, one electrode is the wafer support pedestal and the other electrode is the overhead chamber ceiling, the RF source power being connected across the two electrodes. One type of overhead electrode is disclosed in U.S. Pat. No. 5,900,699 and consists of a set of conductive spokes extending radially outwardly from the center of a circle and another set of spokes, electrically separate from the first set, extending radially inwardly from the circumference of the circle, the two sets of spokes being interleaved. Typically, the length and spacing of the spokes, which is limited by the size of the reactor, limits antenna resonance to the UHF region. Preferably, the antenna is driven at a UHF frequency that is the resonant frequency of the antenna. At resonance, RF currents in adjacent spokes are at different phases, while the phase difference between the inner and outer arrays of spokes is about 180 degrees. The problem with such an antenna is that the impedance match with the UHF power source is relatively unstable over fluctuations in the plasma, either in the match or in the current distributions in the individual spoke legs, the antenna/plasma combination being highly sensitive to plasma load/mode fluctuations. This problem has been addressed by imposing a large capacitance in the form of an insulating layer between the spoke antenna and the plasma. The larger this additional capacitance, fluctuations in plasma load impedance have proportionately less effect on the overall load impedance presented to the UHF signal generator. However, such a large capacitance between the antenna and the plasma acts as a significant voltage divider and does not provide optimum efficiency. Moreover, such an antenna is expensive because it requires a UHF signal generator. Thus, with such unstable impedance match characteristics and high cost, the spoke antenna has not seemed to be a practical choice.

Capacitively coupled plasmas typically are formed at relatively high chamber pressure and low plasma RF source power. The plasma RF source power is coupled into the chamber by applying it across the wafer support pedestal and the overhead ceiling. In such a reactor, the RF power controls both the plasma ion density and the electron temperature at the wafer surface. Inductively coupled plasmas typically are formed at relatively low chamber pressure and high plasma RF source power. The plasma RF source power is coupled into the chamber by a coil antenna near the ceiling or side wall of the chamber whose power level determines ion density. (Electron temperature at the wafer surface can be controlled in such a reactor independently of ion density by a separate RF power source connected across the wafer pedestal and the overhead ceiling.) Thus, whether a plasma is maintained by inductive coupling or by capacitive coupling depends upon the type of antenna employed as well as upon the conditions within the chamber, particularly chamber pressure. Typically, a plasma either is inductively coupled and therefore has the potential for high ion density and etch rate but low etch selectivity or is capacitively coupled and has high etch selectivity but low ion density and etch rate. Thus, there has seemed to be no way to realize the high selectivity of a capacitively coupled plasma without foregoing the high etch rate of an inductively coupled plasma.

SUMMARY OF THE DISCLOSURE

A plasma reactor for processing a semiconductor workpiece, includes a reactor chamber having an insulating chamber ceiling and side wall and a workpiece support pedestal within the chamber, a process gas conduit and gas distribution orifices facing the interior of the chamber and coupled to the process gas conduit. A conductive RF enclosure outside of the chamber overlies the insulating ceiling and has a conductive side wall with a bottom edge supported on the chamber ceiling and a conductive RF enclosure ceiling supported on a top edge of the conductive side wall, and a conductive post extending parallel with the conductive side wall from a center portion of the RF enclosure ceiling toward the chamber ceiling.

An RF power applicator of the reactor includes inner and outer conductive radial spokes. The set of inner conductive spokes extends radially outwardly from and is electrically connected to the conductive post toward the conductive RF enclosure side wall. The set of outer conductive spokes extends radially inwardly toward the conductive post and is electrically connected to the conductive side wall. In this way, the inner and outer sets of conductive spokes are electrically connected together, the combination of the inner and outer set of spokes with the conductive enclosure having a fundamental resonant frequency inversely proportional to the height of the conductive enclosure and the lengths of the inner and outer set of conductive spokes. An RF source power generator is coupled across the RF power applicator and has an RF frequency corresponding to the fundamental resonant frequency.

In one embodiment, the RF power source is connected across an RF tap point on one of the spokes and the conductive enclosure and the RF tap point is near the end of one of the inner set of spokes. In this embodiment, the inner set of spokes are interleaved with the outer set of spokes and are generally coplanar. In this embodiment, the inner and outer sets of spokes are in a plane near the bottom edge of the conductive side wall of the conductive enclosure.

The reactor may further include an insulating base between the RF power applicator and the chamber ceiling. The insulating base has a capacitance which brings a load impedance presented to the RF power source closer to the output impedance of the RF power source than it would otherwise be without the insulating base. The gas distribution manifold and the gas distribution orifices may be formed in the insulating base, the orifices opening out in a bottom surface of the insulating base toward the workpiece support pedestal.

The insulating base may have a top portion defining a 3-dimensionally shaped surface, the inner and outer spokes of the RF power applicator conforming to the 3-dimensionally shaped surface. The spokes of the RF power applicator are shaped by the 3-dimensionally shaped surface so as to render a radial distribution of plasma ion density more uniform. The 3-dimensionally shaped surface may correspond to a multi-radius dome.

The three dimensional shape can modify the power distribution to the plasma. This can add uniformity to the plasma ion density, but more generally, it can tune the process uniformity such that it is not necessarily more or less uniform, but just more beneficial for the process. For example, MERIE chambers intentionally induce a center strong plasma without magnetic fields, and then make the process uniform with their magnetic fields. If this source were to be included with MERIE style magnets, this 3-D surface could be used to enhance this center strong profile, whether or not it makes the source generation of the ion density more uniform.

In one embodiment, the fundamental resonant frequency is a VHF frequency and the RF currents in all of the spokes of the RF power applicator are in phase at the fundamental resonant frequency.

DETAILED DESCRIPTION

Figure 1:
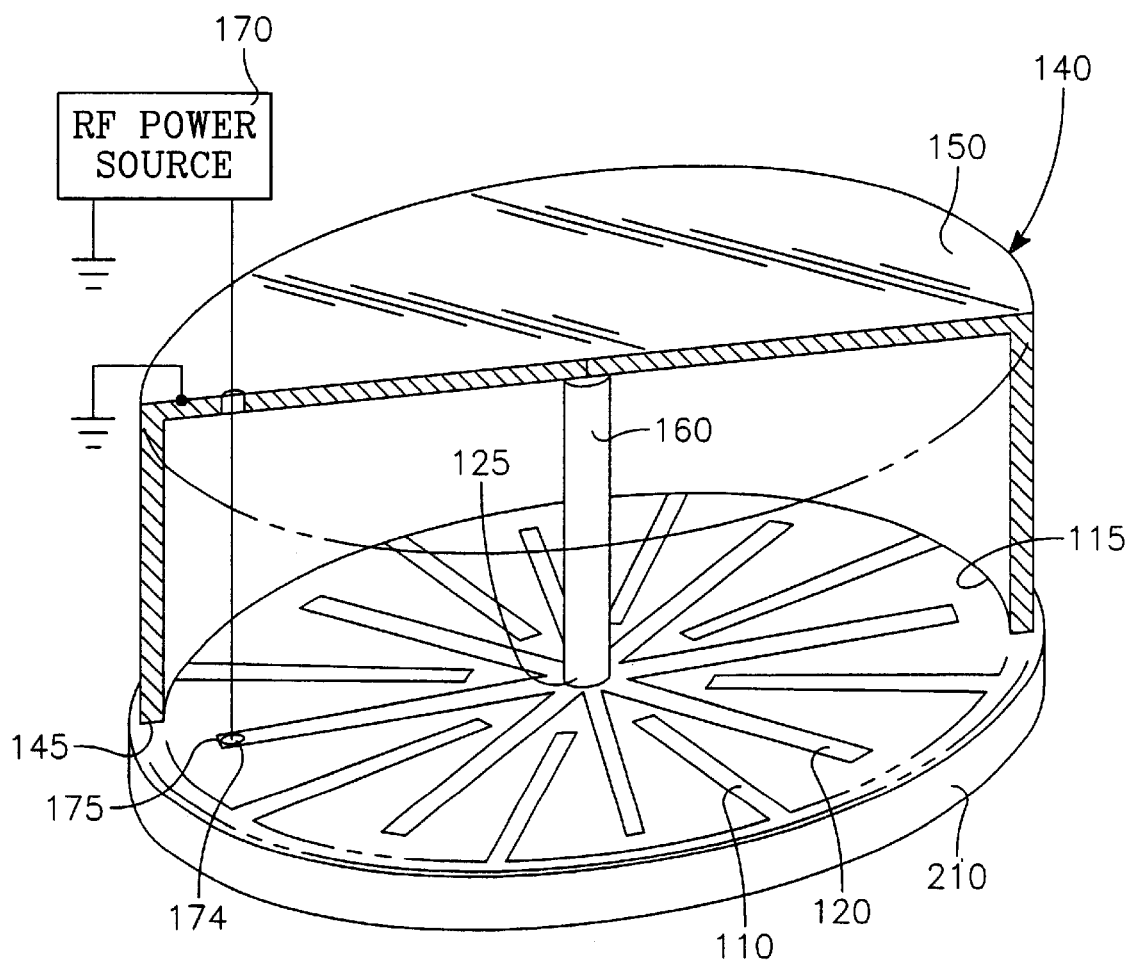
FIG. 1 is a perspective view of a first embodiment.
Figure 2:
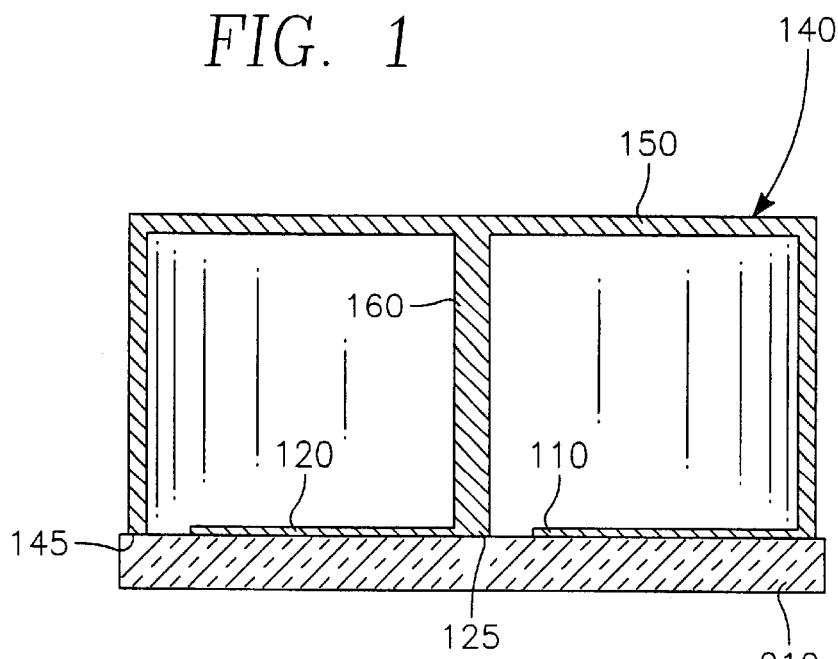
FIG. 2 is a cross-sectional side view corresponding to FIG. 1.
Figure 3:
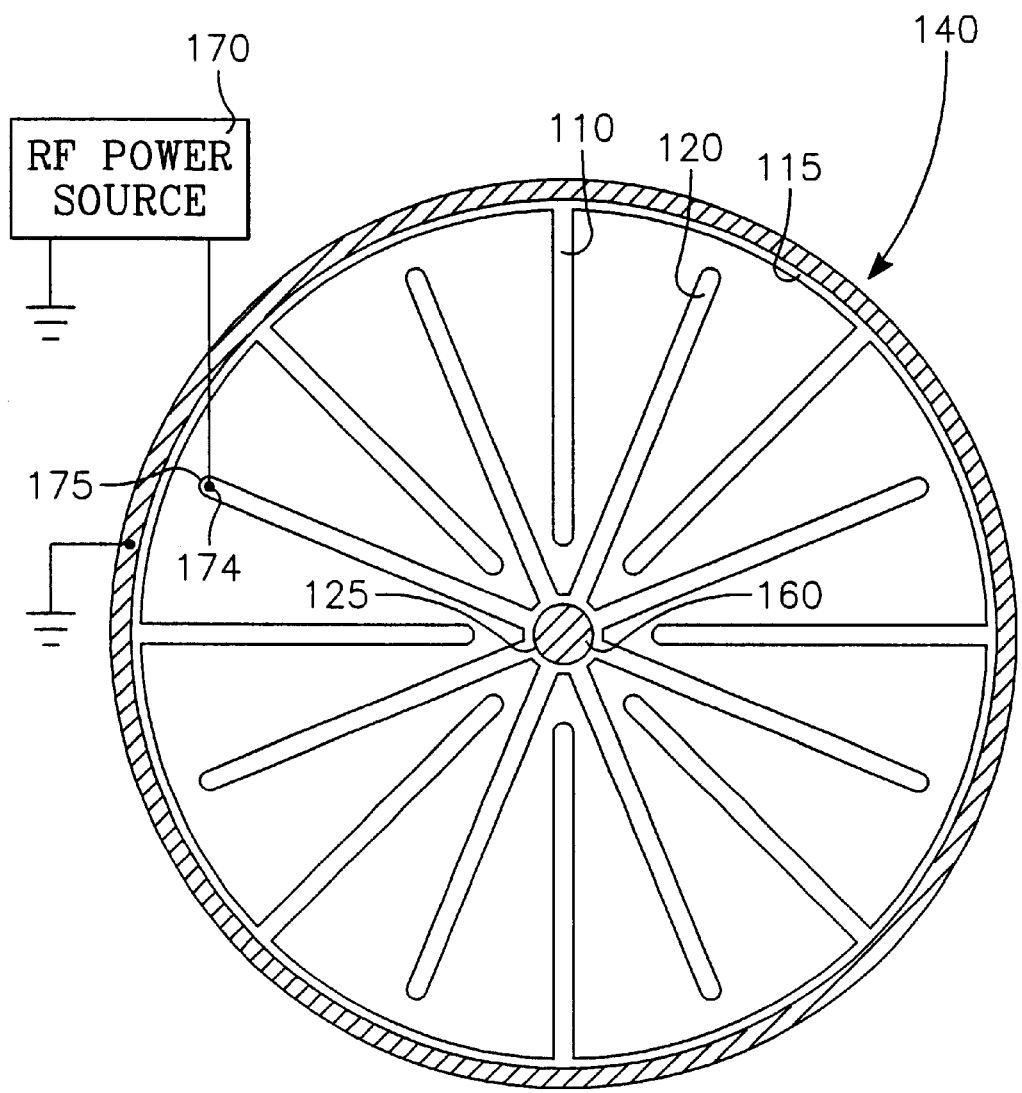
FIG. 3 is a top view corresponding to FIG. 1.

FIGS. 1, 2 and 3 illustrate a spoke antenna of the present invention having a set of outer spokes 110 extending radially inwardly from an outer circumference 115. The outer spokes 110 are interleaved with a set of inner spokes 120 which extend radially outwardly from a central axis 125. Each inner spoke 120 extends for at least nearly 80% of its length between a pair of successive outer spokes 110 and is spaced apart from them by a gap which is at least nearly within an order of magnitude of the width of spokes. Likewise, each outer spoke 110 extends for at least nearly 80% of its length between a pair of successive inner spokes 120 and is spaced apart from them by a gap which is at least nearly within an order of magnitude of the width of spokes. In the illustrated embodiment, all spokes are of about the same length (8.5 cm) and width (1.0 cm). The outer and inner spokes 110, 120 are generally co-planar. The spoke-to-spoke gap is sufficiently large (on the order of the spoke length, as one example) so that the inner spokes 120 and the outer spokes 110 act as separate antenna elements rather than merely as a monolithic conductive sheet with numerous thin apertures.

Rather than being electrically separated from one another, the inner and outer spokes 120, 110 are connected through a large conductive enclosure 140, the enclosure 140 being a cylindrical can having a bottom circumferential edge 145 joining the outer circumference of the set of outer spokes 110. The cylindrical can 140 has a conductive disk ceiling 150 at its top. A conductive post 160 extends downwardly form the center of the disk ceiling 150 and joins the center of the set of inner spokes 120. An RF power source 170 is connected between a tap 174 near the tip 175 of one of the inner spokes and the conductive enclosure 140. The location of the tap 174 along the radial length of the one inner spoke may be adjusted to adjust the load impedance presented by the antenna to the RF power source 170. The spoke antenna source of FIGS. 1 and 2 may be installed over the ceiling of a plasma reactor.

It is a discovery of the invention that by coupling the inner and outer spokes together, for example, through the conductive enclosure 140 as in FIGS. 1 and 2, a new resonance is provided at a VHF frequency on the order of about 70 MHz (rather than the UHF frequency of the spoke antenna of the prior art). Thus, the RF power source 170 is a VHF power source set to the VHF resonant frequency of the antenna. It is a further discovery that this VHF resonance maintains RF current in all the spokes within both the inner and outer sets 120 and 110 at the same phase. The result of this in-phase relationship is an electromagnetic field pattern that corresponds to that produced by an inductively coupled reactor with overhead coil antenna, but with the roles of the electric and magnetic fields reversed, as will be explored in greater detail hereinbelow. It is a yet further discovery that this VHF resonance provides a highly stable impedance match between the antenna and the RF source. Thus, it is not necessary to install a large capacitance between the antenna and the plasma in order to mask fluctuations in the plasma load impedance from the RF power source (as is required in the prior art).

A further advantage is that the size of the conductive enclosure 140 determines the VHF resonant frequency, while the location of the tap 174 determines the impedance of the antenna. In the illustrated embodiment, the conductive enclosure 140 is an upright cylindrical RF can or shield, and its height as well as its diameter affect the resonant length between the tips of the inner and outer sets of spokes 120, 110, thus determining the resonant frequency. Since the impedance match realized at the VHF resonant frequency is highly stable, no measures are particularly necessary (at least in the illustrated embodiment) to stabilize the match against plasma load impedance fluctuations. All that is required is that the RF source frequency match the resonant frequency of the antenna 110, 120, and that the impedance presented at the input to the antenna 110, 120 be nearly the same as the output impedance of the RF source. The resonant frequency is determined by the size of the conductive enclosure 140 (e.g., its height and its diameter). It should be noted that the plasma load does present a non-zero, but minor perturbation of the resonant frequency of the system. The antenna load impedance is adjusted to the RF source output impedance (typically 50 Ohms) by introducing a small capacitance or by adjusting the position of the tap 174 or both. Typically, the additional capacitance would be a very small capacitance provided by an insulator layer between the antenna and the plasma or the chamber interior. A ceramic layer 210 illustrated in FIG. 2 serves this purpose. In contrast with the prior art, the ceramic layer 210 has a small capacitance chosen to bring the load impedance of the antenna 110, 120 to near 50 Ohms. (In the prior art, an insulating layer in the same location must provide such a large capacitance that it can nearly mask fluctuations in the plasma load impedance as observed at the output of the signal generator.) Alternatively, a conventional pi or L match circuit could be introduced between the RF source and the antenna 110, 120 in order to bring the load impedance closer to 50 Ohms. Of course, an impedance match circuit could be connected between the plasma RF power source and the spoke antenna 110, 120.

Figure 4:
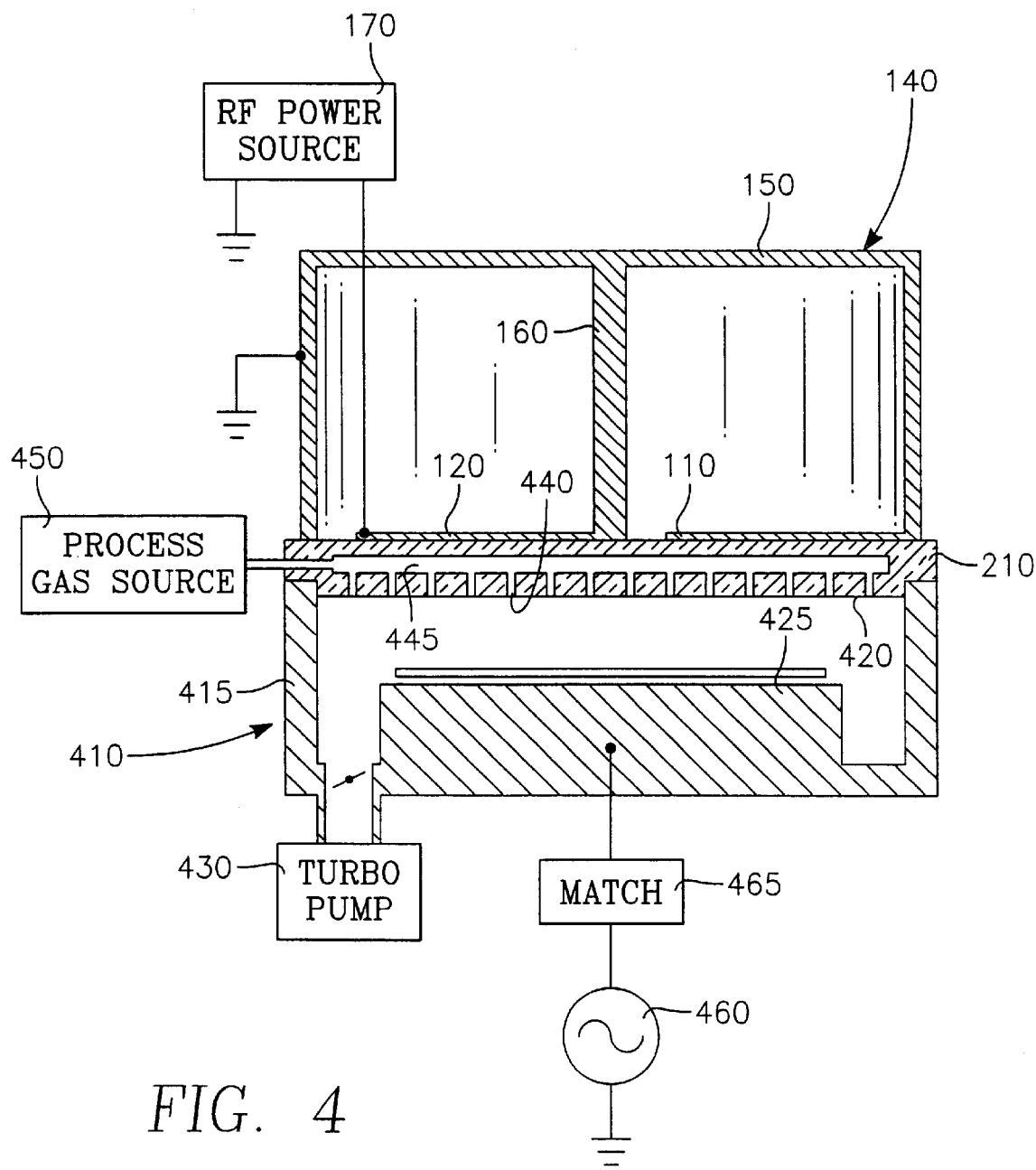
FIG. 4 illustrates a reactor incorporating the antenna of FIG. 1.

Referring now to FIG. 4, an exemplary reactor that employs the spoke antenna of FIGS. 1–3 includes a reactor chamber 410 defined by a cylindrical side wall 415, a disk shaped flat ceiling 420 overlying the side wall 415, a wafer support pedestal 425 within the chamber and a turbo pump 430 for maintaining the chamber at a desired pressure. The ceramic layer 210 overlies the ceiling 420. Plural downwardly facing gas injection orifices 440 with a common manifold 445 are formed within the ceramic layer 210 so that the ceramic layer 210 is a gas distribution plate. Alternatively, process gas may be injected sideways rather than (or in addition to) downwardly, for example, from injectors at the side wall. A process gas source 450 is connected to the common manifold 445. Alternatively, the ceiling 420 itself is the ceramic layer. In order to independently control electron energy at the surface of the wafer support pedestal 425, a separately adjustable bias RF power source 460 may be connected to the wafer support pedestal 425. An impedance match circuit 465 may be connected between the bias RF power source 460 and the wafer support pedestal 425. The bias RF power source has a frequency which is very different from the VHF frequency of the plasma RF power source 170, so that the two sources do not conflict with one another. For example, the bias RF power source 460 has a HF frequency of about 13.56 MHz while the plasma power source 170 has a frequency of about 70 MHz.

Figure 5:
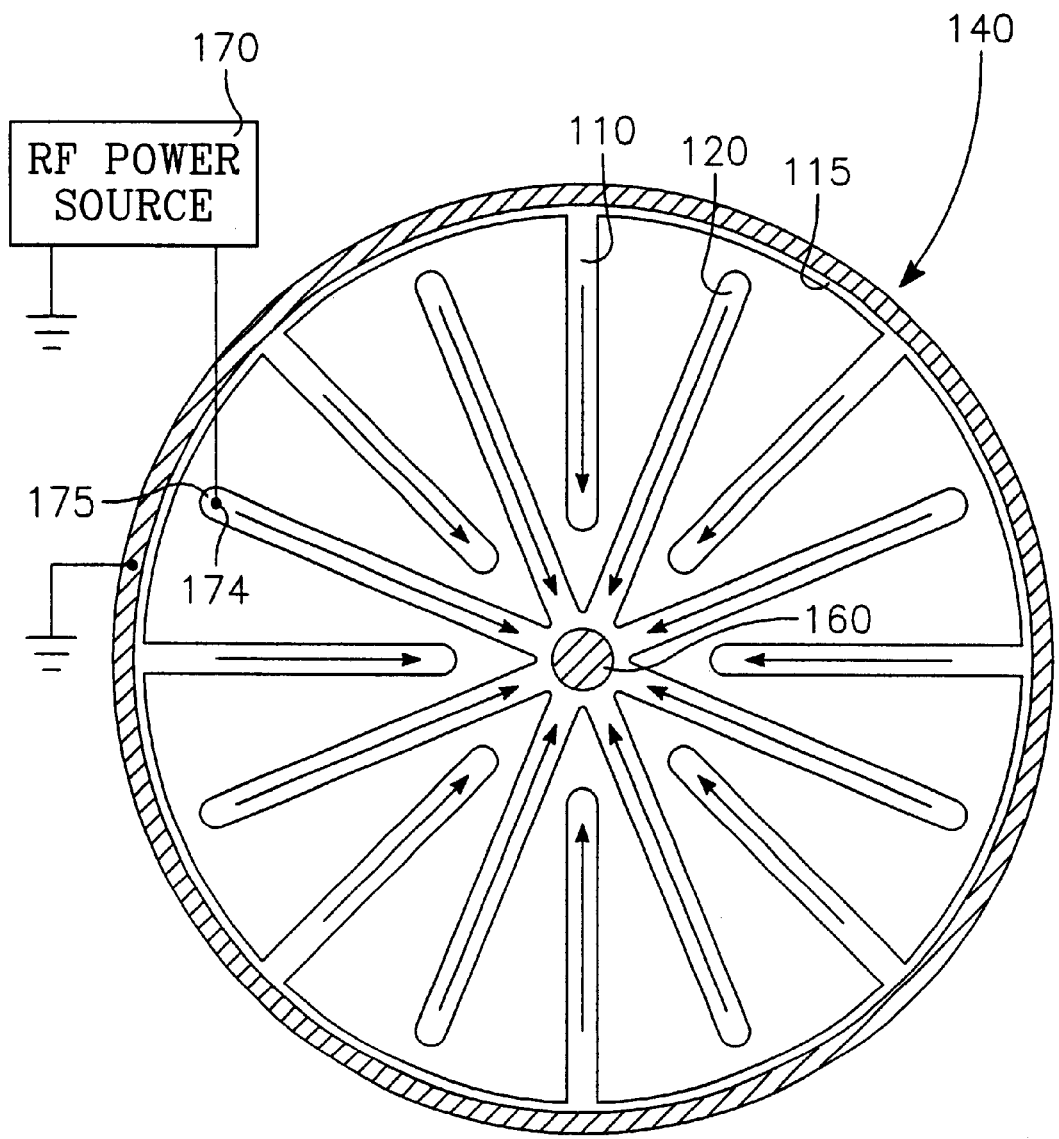
FIG. 5 illustrates RF current flow in the antenna of FIG. 1.

FIG. 5 illustrates the RF current pattern in the outer and inner sets of spokes 110, 120. Mutual inductance between adjacent spokes causes currents to run in the same direction through all the spokes simultaneously. In FIG. 5, during a negative quarter of the RF cycle, power flows from the outer circumference to the center and thence up through the center post 160 and back to the cylindrical conductive enclosure 140. During a positive part of the same cycle, the current flow is in the opposite direction. This is the result of the low frequency (70 MHz) resonant mode of the antenna that makes the RF currents in all of the spokes run in phase in the form of a standing wave.

As mentioned above in this specification, the electric and magnetic field pattern corresponds with that of an inductively coupled reactor with an overhead coil electrode, but with the roles of the electric and magnetic fields reversed. Specifically, the spoke antenna of FIGS. 1–4, when operated at its low frequency (VHF) resonance, produces an azimuthal magnetic field and a radial electric field. The azimuthal magnetic field arises because the currents in each of the spokes are of the same phase and their individual circular magnetic fields add constructively. The radial electric field arises because the current flow from the highest to the lowest RF electric potential is radial.

The spoke antenna of FIGS. 1–4 solves the problem of attaining high etch selectivity at high etch rates. This is because it has been determined that as RF power applied to the spoke antenna is increased so as to increase plasma ion density and etch rate, the population distribution dissociated species does not change. Specifically, the degree to which process gas species are dissociated into simpler species does not increase appreciably if at all. Thus, for example, the proportion of free fluorine in the plasma does not increase with increasing RF source power or plasma ion density. As a result, the etch rate is greatly increased beyond that of a conventional capacitively coupled reactor with little or no diminishment of etch selectivity. Although we did not directly measure the electron density of the spoke antenna discharge, our optical emission spectra (OES) measurements and the bulk bias voltage response of the system to increasing source power both indicate an increase by a factor of between two and four in ion density above what is capable in a conventional capacitively coupled reactor.

Thus, the spoke antenna of FIGS. 1–4 provides plasma enhancement without significantly changing the plasma chemistry from that produced in a capacitively coupled plasma generated by RF bias only. This allows for faster etch rates of thin films while maintaining high etch selectivity over the top photoresist pattern. This provides increased production throughput of semiconductor wafers with high aspect ratio features.

Figure 6A:
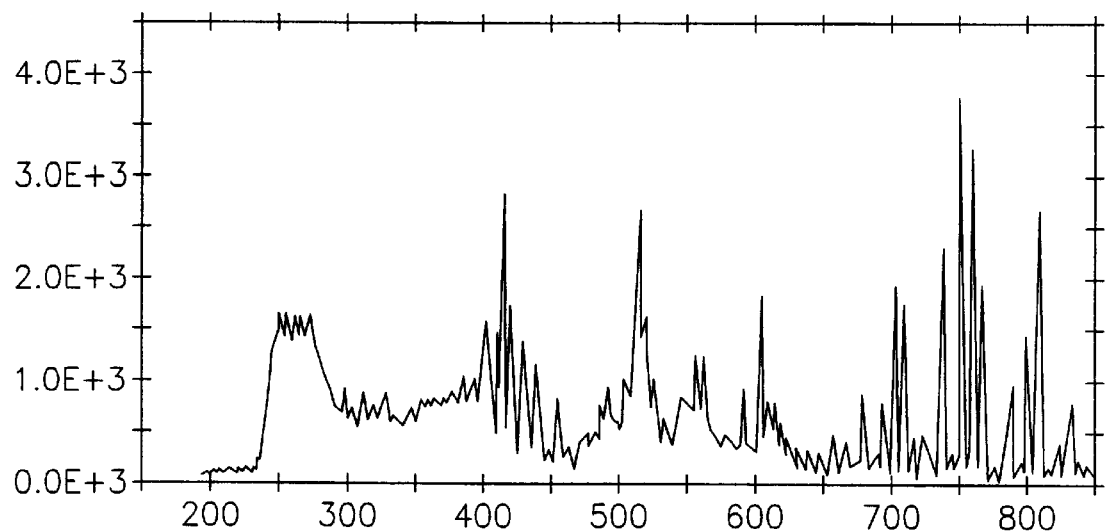
FIGS. 6A and 6B illustrate the optical emission spectra of the reactor of FIG. 4.
Figure 6B:
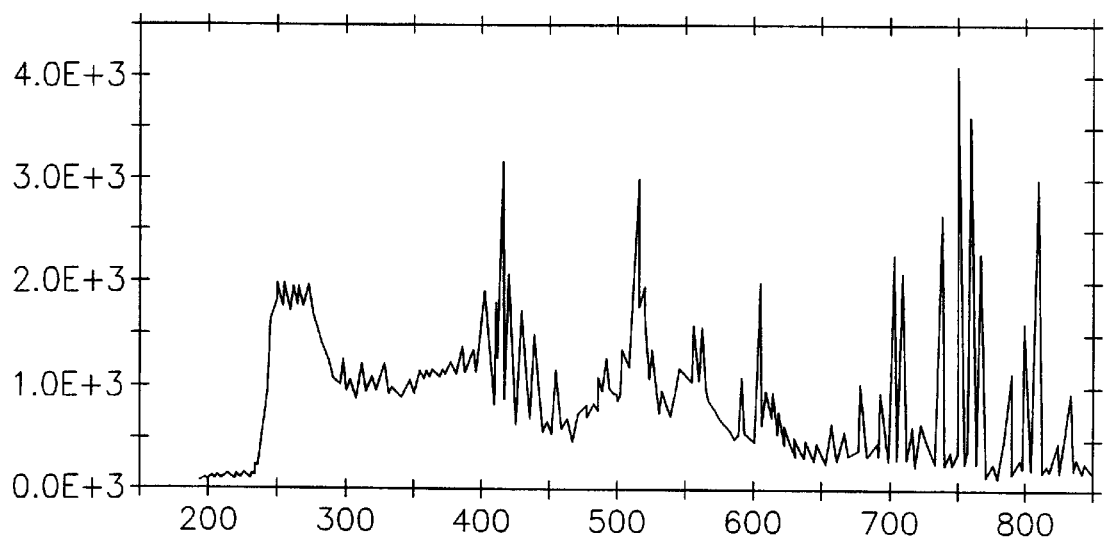

FIGS. 6A and 6B illustrate the optical emission spectra of a conventional capacitively coupled reactor operated at 327 Watts and that of a reactor having the spoke antenna of FIGS. 1–4 operated at 327 Watts and operated at 720 Watts, the process conditions in each of the three case being the same other than source power (i.e., the same chamber pressure, the same process gas, the same gas flow rate, the same bias power on the wafer pedestal). FIG. 6 shows that the capacitively coupled reactor and the FIGS. 1–4 spoke antenna have the same chemistry at 320 Watts. Furthermore, there is an overall increase in optical emission intensity at 720 Watts of the FIGS. 1–4 spoke antenna, due to the higher plasma ion density, but there appears to be no significant change in the relative intensities of each of the peaks. The CFx species peaks correspond to desirable complex fluorocarbon species that tend not to attack polymer and photoresist. The C2 species peaks correspond to extreme dissociation that also produces the undesirable free Fluorine. These results indicate an overall increase in dissociated species without a significant change in plasma chemistry from that which achieves maximum etch selectivity. This illustrates that the structures of FIGS. 1–5 enable plasma formation while retaining good electron energy distribution control.

Figure 7A:
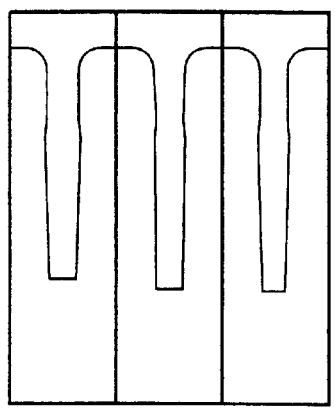
FIGS. 7A, 7B and 7C illustrate etch profiles obtained using the reactor of FIG. 4.
Figure 7B:
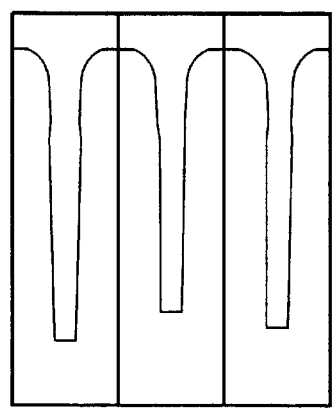
Figure 7C:
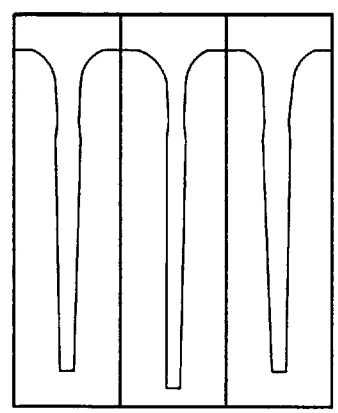

The actual results of the three foregoing comparative examples are shown in FIGS. 7A, 7B and 7C, respectively. Each of these three figures show the etch profile obtained for the corresponding process at three different locations on the wafer. FIGS. 7A, 7B and 7C illustrate etch opening profiles obtained using the conventional capacitively coupled reactor, the FIGS. 1–4 spoke antenna at 327 Watts and the FIGS. 1–4 spoke antenna at 720 Watts, respectively. The spreading at the top of the opening attributable to some etching of the photoresist is nearly the same for all three examples, which is a remarkable result. However, FIG. 7C shows the same quality results but with a much deeper etch depth, proving the suitability of the FIGS. 1–4 spoke antenna for high aspect ratio openings at high etch rates.

Figure 8A:
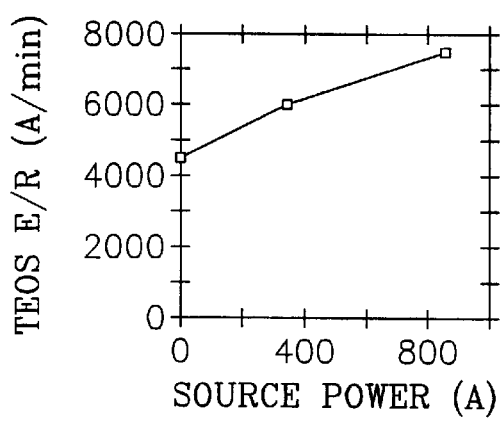
FIGS. 8A and 8B are graphs depicting dielectric and photoresist etch selectivities, respectively, as a function of source power in the reactor of FIG. 4.
Figure 8B:
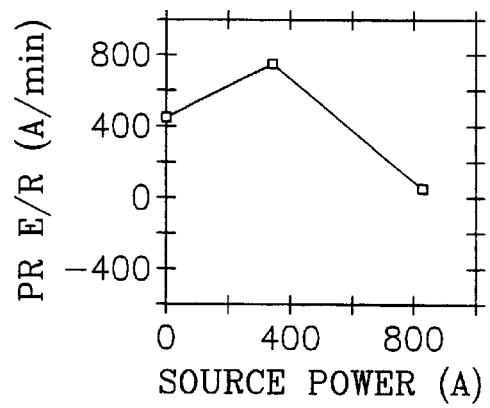

FIGS. 8A and 8B show remarkable measurements of oxide etch rate (FIG. 8A) and photoresist etch rate in the same process using the FIGS. 1–4 spoke antenna as a function of source power. Note that in FIG. 8A, the oxide etch rate increases with increasing source power (and therefore with increasing etch rate) while FIG. 8B illustrates the surprising result that the photoresist etch actually decreases above about 300 Watts. Thus, the FIGS. 1–4 spoke antenna can be operated at maximum plasma power/etch rate without compromising etch selectivity. In fact the selectivity appears to actually improve with increasing etch rate (from an inspection of FIGS. 8A and 8B). We are unaware of such a remarkable result being attained in any other type of plasma reactor. The maximum etch rate and plasma ion density of the FIGS. 1–4 spoke antenna rivals that of high density inductively coupled reactors, but does not suffer their inferior etch selectivity, a significant advantage.

Figure 9:
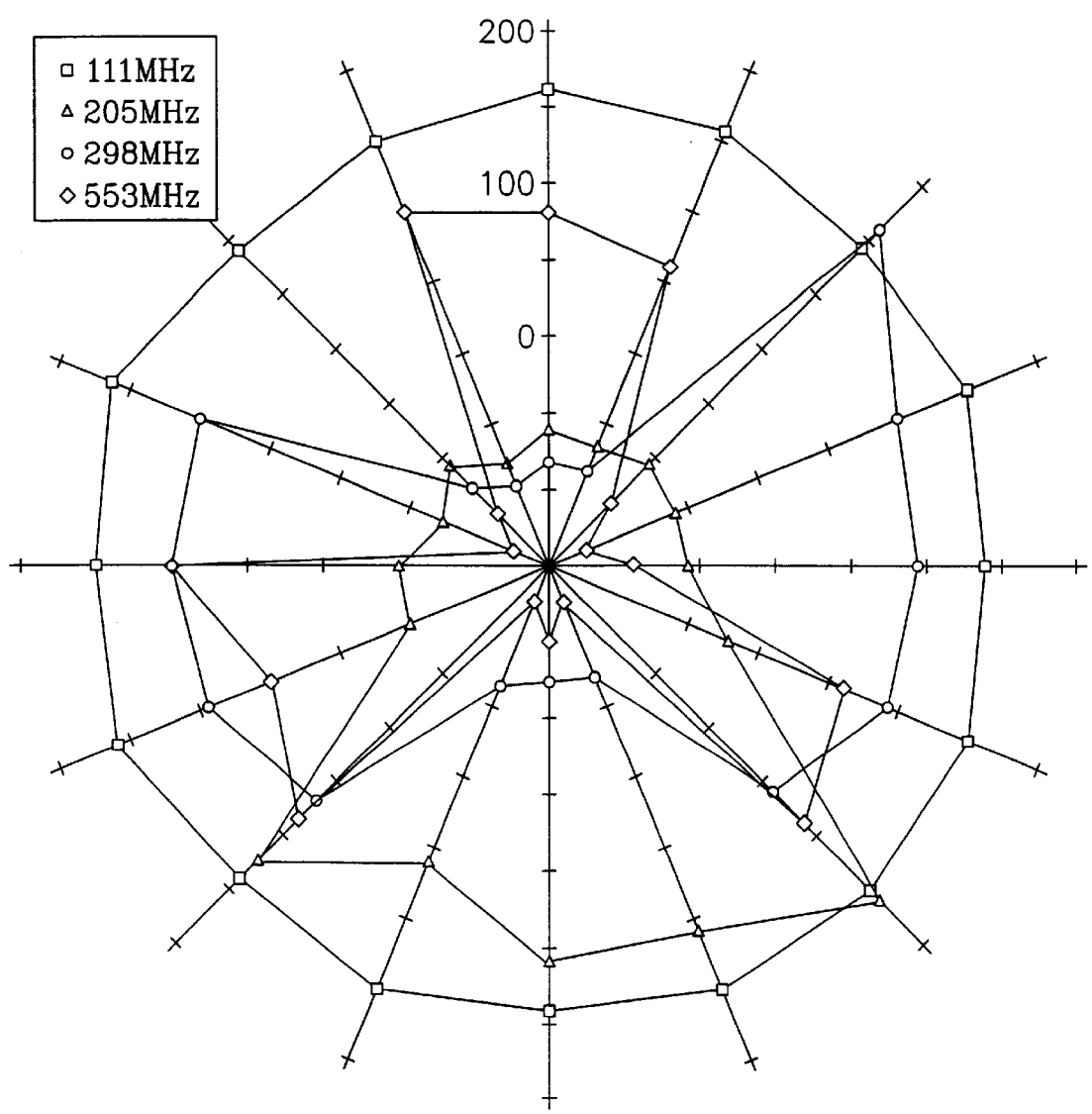
FIG. 9 illustrates the RF current phase in each spoke of the antenna of FIG. 1.

FIG. 9 illustrates the phase (radial amplitude) as a function of spoke position (angle) for a FIGS. 1–4 spoke antenna having sixteen uniformly spaced radial spokes. The fundamental resonance obtained at 111 MHz is realized by virtue of the connection of the inner and outer spoke arrays through the conductive enclosure 140. For this fundamental resonant mode, the RF currents (or voltages) in all sixteen spokes are in phase, as illustrated in FIG. 9. The second harmonic mode occurs at 205 MHz and the third and fourth harmonics at 298 and 553 MHz respectively. For each of the latter three modes, all spokes are out of phase by varying degrees, so that there is no constructive addition of magnetic fields as there is in the fundamental mode. As discussed previously hereinabove, the in-phase relationship of the RF currents in all of the spokes in the newly discovered fundamental VHF mode enables the circular RF magnetic fields around each of the spokes to add constructively so as to yield an azimuthal RF magnetic field. From FIG. 9, it can be seen that this result is unique to the fundamental VHF resonance found only in the FIGS. 1–4 spoke antenna. In the illustrated version of the spoke antenna of FIGS. 1–4, the fundamental VHF mode may be around 70 MHz or may be higher (e.g., 111 MHz as discussed with reference to FIG. 9) due to variations in size and geometry between different implementations of the spoke antenna of FIGS. 1–4.

The 111 MHz resonance converges to the 70 MHz resonance when the plasma and higher dielectric constant window is added to the equivalent circuit. The measurements taken with the 111 MHz resonance was with the same spoke configuration 110, 120 resting on a ceiling 150 of different insulating material (Quartz instead of Alumina), without a plasma load. The other modes are also pulled down, but still exist in the UHF/quasi-UHF range.

Figure 10:
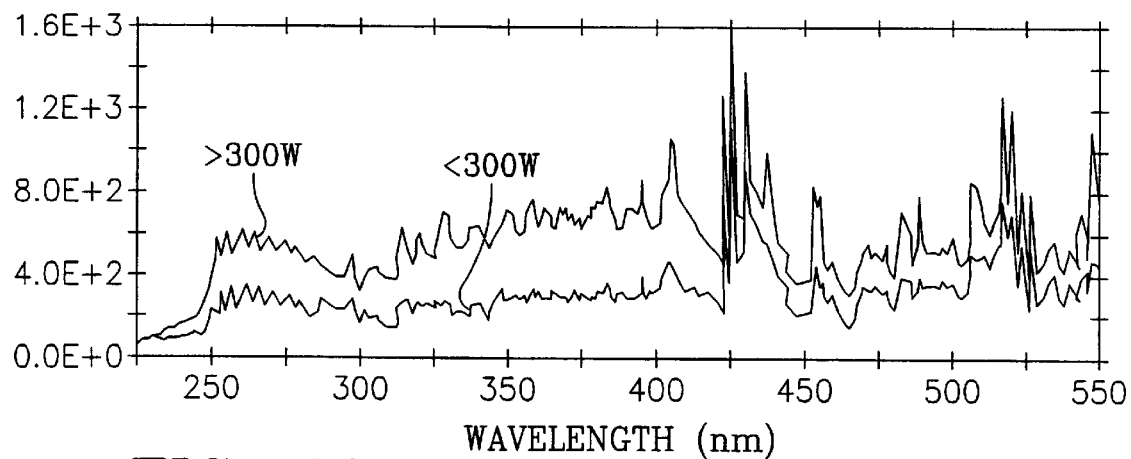
FIG. 10 illustrates optical emission spectra obtained in the reactor of FIG. 4 for various plasma RF source power levels.
Figure 11:
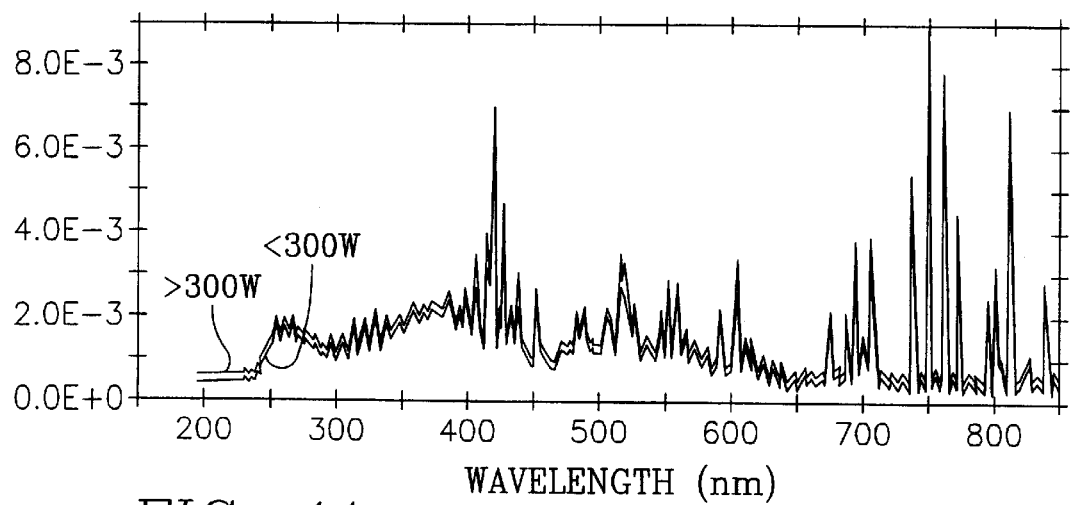
FIG. 11 is a graph of the optical emission spectra of FIG. 10 with normalized amplitudes for the purpose of comparison.

FIG. 10 illustrates the OES spectrum of the FIGS. 1–4 spoke antenna at various power levels, including a first one under 300 Watts and several above 300 Watts. Above 300 Watts, the diverse spectrum appears to remain constant other than an overall increase in intensity due to the increase in plasma ion density. This appears to indicate that the desirable plasma chemistry obtained at lower power (a chemistry which provides ideal etch selectivity) does not change as the plasma ion density/source power is increased. That this is so is best seen in FIG. 11 in which each of the curves of FIG. 10 above 300 Watts source power is normalized to the same amplitude and then all normalized curves are superimposed in FIG. 11. FIG. 11 shows that such curves are nearly identical, proving a nearly complete absence of chemistry changes with increasing source power and plasma ion density.

Figure 12:
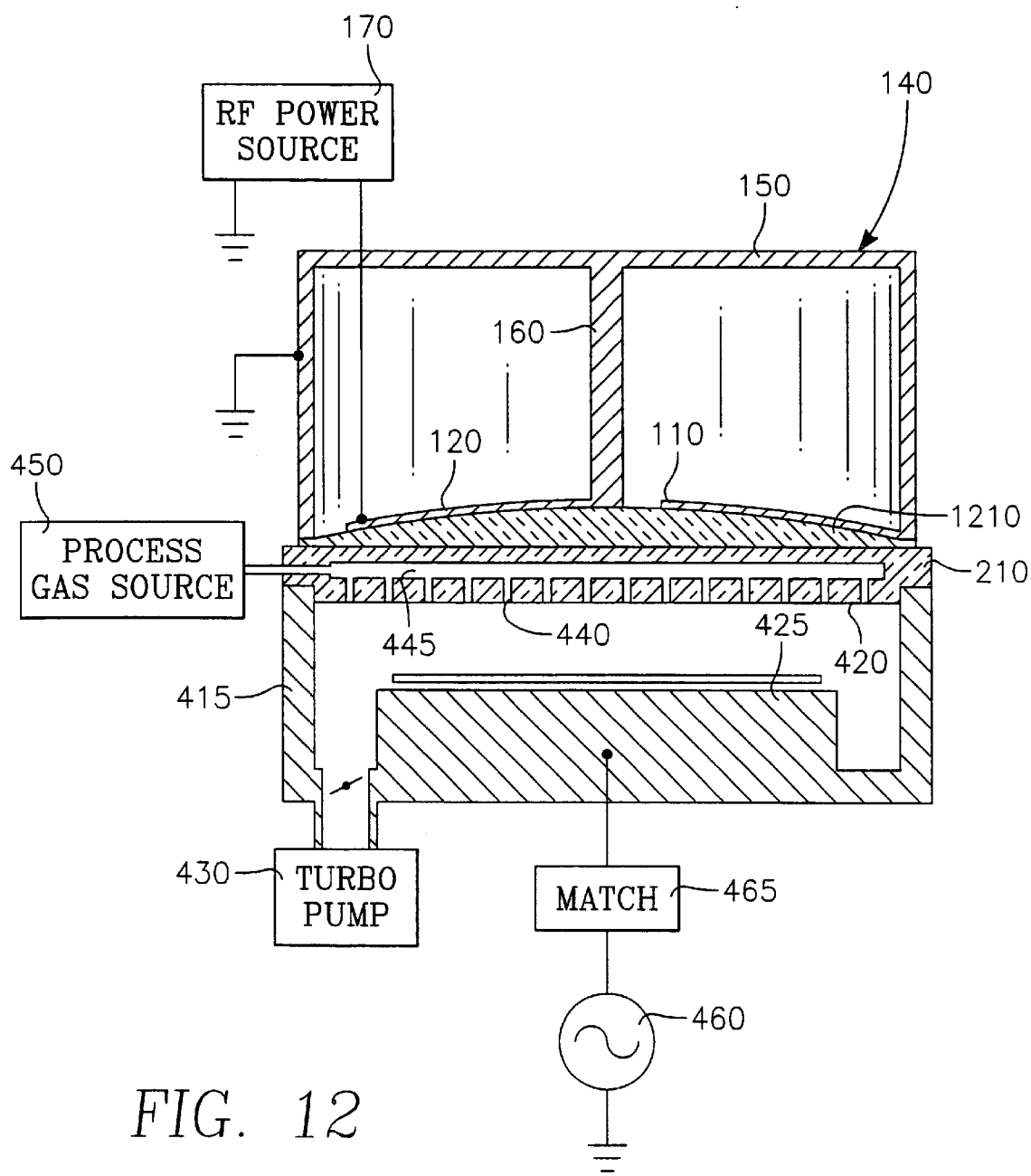
FIG. 12 illustrates a second embodiment.

FIG. 12 illustrates a version of the spoke antenna of FIGS. 1–4 in which the spokes conform with a 3-dimensional surface which is concave facing the chamber. The greater height of the middle of the spoke array 110, 120 compensates for diffusion effects which would otherwise tend to enhance plasma ion density over the center of the wafer support pedestal 125 while diminishing it at the circumferential edge. The 3-dimensional surface may define a multi-radius dome for example, or, alternatively, a hemispherical dome.

The three-dimensional geometry of FIG. 12 is facilitated by a ceramic dish 1210 having a flat bottom surface lying on the ceramic gas distribution plate 210 and a multi-radius dome top surface on which the spoke antenna is supported and with which the spoke antenna arrays 110, 120 conform.

Figure 13:
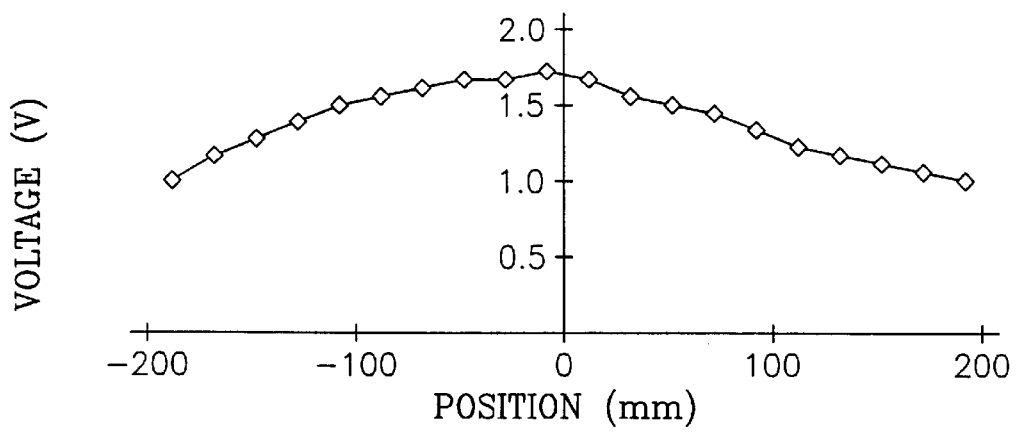
FIG. 13 illustrates the radial profile of electrical potential obtained in a reactor of the type illustrated in FIG. 4.
Figure 14:
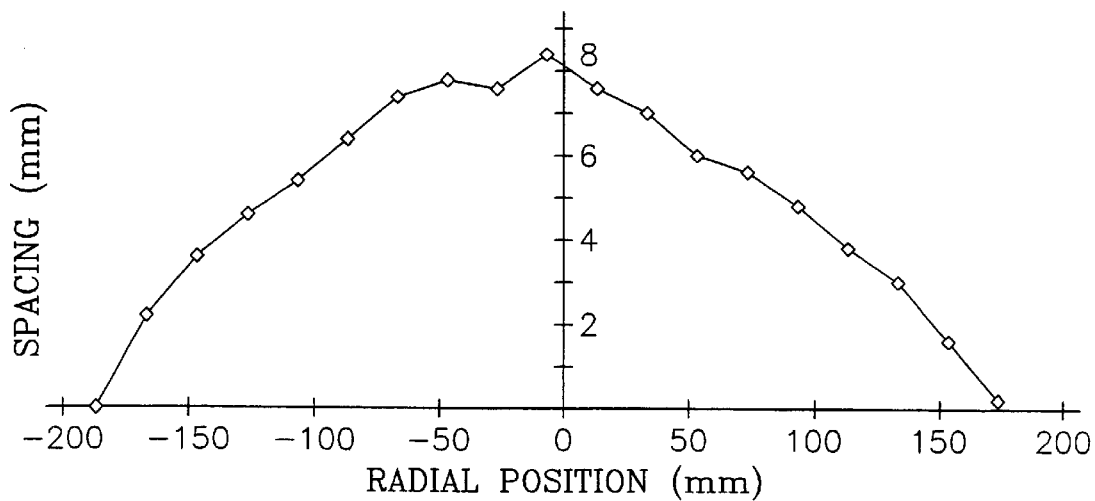
FIG. 14 illustrates the ceiling profile of the embodiment of FIG. 12 for optimizing the electrical potential profile.

Non-uniformity in the radial distribution of the electric field measurements in the flat spoke antenna of FIGS. 1–4 is illustrated in FIG. 13. In order to realize a radially uniform field distribution, the curvature of the ceramic dish 1210 and the conforming spoke antenna arrays 110, 120 should conform to the 3-dimensional shape illustrated in FIG. 14, in one implementation. However, different shapes of reactor and spoke antenna arrays will require different 3-dimensional shapes of the spoke antenna arrays 110, 120 in order to achieve uniform radial distribution of plasma ion density.

Figure 15:
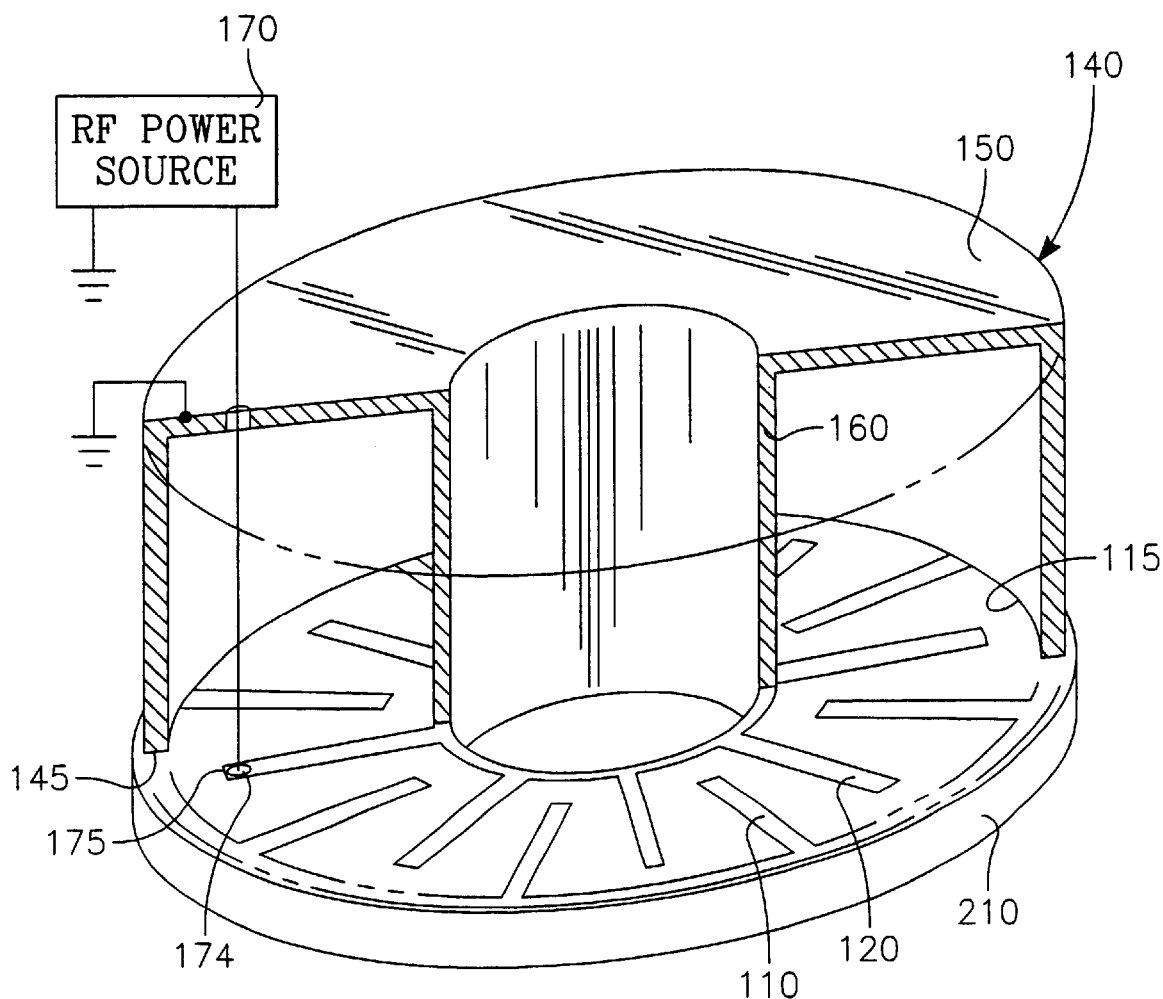
FIG. 15 illustrates a third embodiment.
Figure 16:
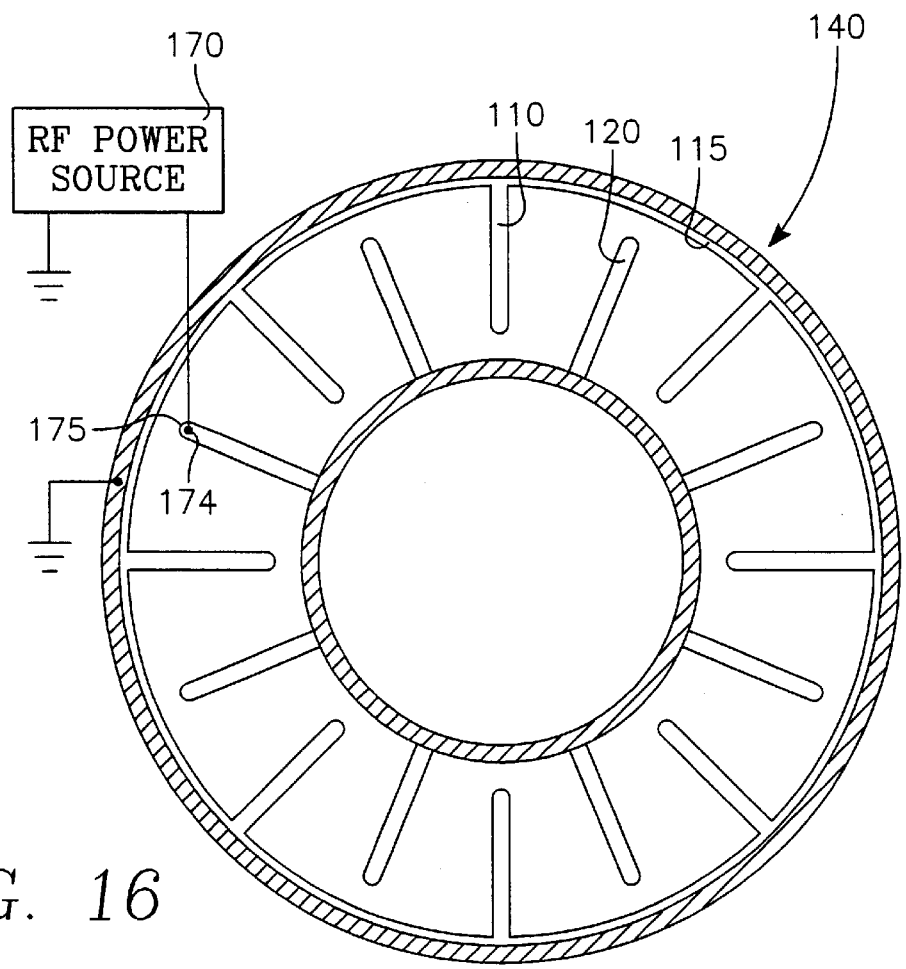
FIG. 16 is a cut-away top view corresponding to FIG. 15.
Figure 17:
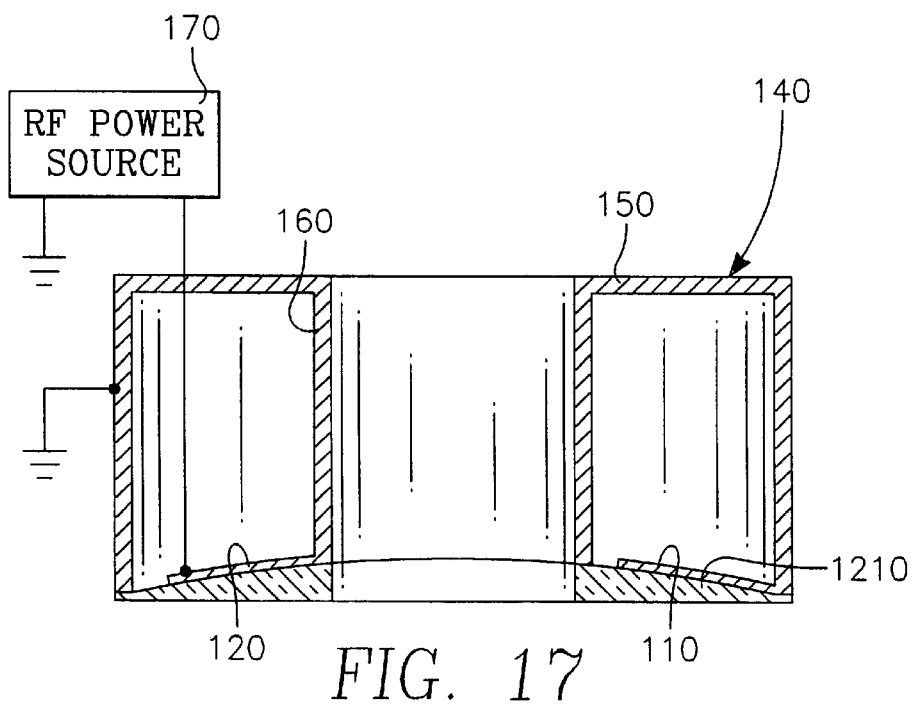
FIG. 17 is a side view corresponding to FIG. 15.

Thus, the 3-dimensional shape of the spoke antenna array 110, 120 compensates for effects that produce a center-high radial distribution of plasma ion density, such as diffusion, asymmetric power distribution, external field effects, etc. As another measure to compensate for these effects, the inner spoke antenna array 120 may have an aperture in the center to reduce the electric and magnetic fields over the center of the wafer support pedestal 125. This concept is illustrated in FIGS. 15 and 16 for a flat spoke antenna 110, 120 of FIGS. 1–4. In FIGS. 15 and 16, the conductive post 160 supporting the inner spoke array 120 is hollow so that no conductor overlies the center of the wafer support pedestal 125. FIG. 17 illustrates how this same concept is applied to the 3-dimensional spoke antenna of FIG. 12. In FIG. 17, the 3-dimensional shape of the spoke antenna 110, 120 is a multi-radius dome, corresponding to the multi-radius dome shape of the top surface of the 3-dimensionally shaped ceramic plate 1210.

In conclusion, a new structure for a radial spoke antenna adapted to cover a reactor chamber that is between about 10 and 30 inches in diameter has been discovered that operates in a fashion entirely different from operating modes of conventional spoke antenna. Specifically, the RF currents in all of the spokes are in phase at the fundamental resonant frequency. Unlike conventional radial spoke antennas, the fundamental resonant frequency is a VHF frequency, in contrast with the UHF resonant frequency of a conventional spoke antenna. The new structure achieves this by electrically connecting the inner and outer spokes together in such a way that an RF current can resonate between the tips of the inner radial spokes to the tips of the outer radial spokes. This results in a longer resonant wavelength and therefore a lower resonant frequency. Because the spoke RF currents are in phase, their fields add constructively and thereby provide an azimuthal RF magnetic field and an axial electric field.

All this is accomplished by coupling the outer perimeter of the outer radial spokes to the circumference of a conductive enclosure surrounding the antenna and the center of the inner radial spokes to the ceiling of the conductive enclosure. The resonant frequency is reduced in accordance with the height of the conductive enclosure. This antenna may be RF driven in any fashion that forces the RF currents to flow radially through the spokes. In the illustrated embodiment, the RF power source is connected to or near the tip of one of the inner radial spokes while the conductive enclosure is grounded. Depending upon the standing wave pattern induced in the spokes, the radial location of the RF power source connection on the one spoke may be adjusted to adjust the input impedance presented by the spoke antenna. Thus, two adjustments may be made: (1) the resonant frequency is adjusted by adjusting the height of the RF enclosure, and (2) the input impedance of the spoke antenna is adjusted by adjusting the location of the RF power source tap on the one inner spoke.

Other ways of connecting the RF power source to the radial spoke antenna are possible. For example, the RF power tap may be on one of the outer spokes instead of the one inner spoke.

In an exemplary embodiment for performing an oxide etch process on 200 mm diameter semiconductor wafers, the resonant frequency and the frequency of the RF source 170 connected to the array of inner and outer spokes 110, 120 was about 70 MHz and the power was 700 Watts, the frequency of the RF bias source connected to the pedestal was 13.56 MHz and the power was 2800 Watts, the process gas was $C_4F_6/O_2/Ar$ the gas flow rate was 54/45–50/700 SCCM, the chamber pressure was 30–60 mTorr. The radial length of the outer spokes was 8.5 cm the radial of the inner spokes was 8.5 cm the radius of the RF enclosure 140 was 11.81 inches and the height of the RF enclosure was 2.56 in. The resulting oxide-to-photoresist etch selectivity was at least 7 and as great as 20.

While various geometries of the inner and outer radial spokes may be employed, in the exemplary embodiment, the inner spokes extended from their common center out to a diameter that was at least about 70% of the length of the diameter of the periphery of the outer spokes, so that the two sets of spokes were interleaved but did not touch. In this embodiment, there were eight outer spokes and eight inner spokes.

Figure 18:
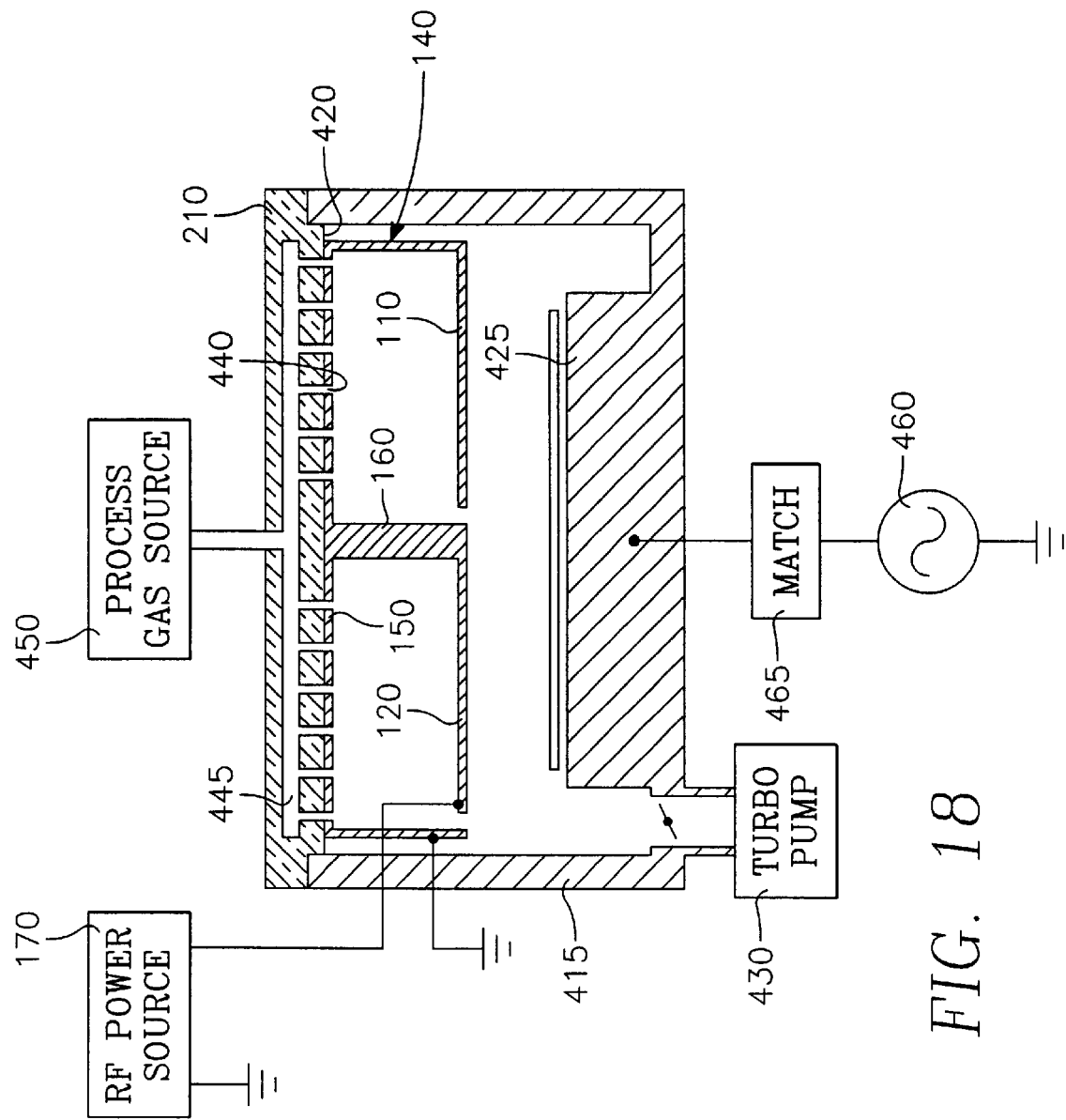
FIG. 18 illustrates an alternative embodiment in which the RF power applicator of FIG. 1 is inside the reactor chamber.

FIG. 18 illustrates an alternative embodiment in which the RF power applicator constituting the inner and outer spokes 110, 120 are inside the chamber 410 and beneath the ceiling 420. In the embodiment of FIG. 18, the RF enclosure 140 is also beneath the ceiling 420 and inside the chamber 410.

While the invention has been described in detail with specific reference to preferred embodiments, it is understood that variations and modifications thereof may be made without departing from the true spirit and scope of the invention.

What is claimed is:

1. A plasma reactor for processing a semiconductor workpiece, comprising:

a reactor chamber having a chamber ceiling and a chamber side wall and a workpiece support pedestal within the chamber;

a gas distribution manifold and gas distribution orifices facing the interior of the chamber and coupled to the process gas conduit;

a conductive enclosure outside of the chamber and overlying the ceiling and having a conductive side wall with a bottom edge supported on said chamber ceiling and a conductive ceiling supported on a top edge of said conductive side wall, and a conductive post extending parallel with said conductive side wall from a center portion of said conductive ceiling toward said chamber ceiling;

an RF power applicator comprising:
(a) a set of inner conductive spokes extending radially outwardly from and electrically connected to said conductive post toward said conductive side wall,
(b) a set of outer conductive spokes extending radially inwardly toward said conductive post and from and electrically connected to said conductive side wall, whereby said inner and outer sets of conductive spokes are electrically connected together;

an RF source power generator coupled across said RF power applicator;

wherein said inner set of spokes are interleaved with said outer set of pokes;

wherein said inner and outer sets of spokes are generally co-planar; and wherein said inner and outer sets of spokes are in a plane near the bottom edge of said conductive side wall of said conductive enclosure.

2. The apparatus of claim 1 wherein said RF power source is connected across an RF tap point on one of said spokes and said conductive enclosure.

3. The apparatus of claim 2 wherein said RF tap point is near the end of one of the inner set of spokes.

4. The apparatus of claim 1 further comprising an insulating base between said RF power applicator and said chamber ceiling.

5. The apparatus of claim 4 wherein said insulating base has a capacitance which brings a load impedance presented to said RF power source closer to the output impedance of said RF power source than it would otherwise be without said insulating base.

6. The apparatus of claim 5 wherein said gas distribution manifold and said gas distribution orifices are formed in said insulating base, said gas distribution orifices opening out in a bottom surface of said insulating base toward said workpiece support pedestal.

7. The apparatus of claim 5 wherein said output impedance of said RF source is 50 Ohms.

8. The apparatus of claim 4 wherein said insulating base has a top portion defining a 3-dimensionally shaped surface, the inner and outer spokes of said RF power applicator conforming to said 3-dimensionally shaped surface.

9. The apparatus of claim 8 wherein said spokes of said RF power applicator are shaped by said 3-dimensionally shaped surface so as to render a radial distribution of plasma ion density more uniform.

10. The apparatus of claim 9 wherein said 3-dimensionally shaped surface is farther from said workpiece support pedestal at its center than at its periphery.

11. The apparatus of claim 10 wherein said 3-dimensionally shaped surface corresponds to a multi-radius dome.

12. The apparatus of claim 1 wherein the combination of said RF power applicator with said conductive enclosure has a fundamental resonant frequency which is a VHF frequency.

13. The apparatus of claim 12 wherein the RF currents in all of the spokes of said RF power applicator are in phase at said fundamental resonant frequency.

14. The apparatus of claim 12 wherein said fundamental resonant frequency corresponds to a wavelength distance from the tips of the inner spokes to the tips of the outer spokes.

15. The apparatus of claim 1 further comprising:
a plasma bias RF power generator coupled to said workpiece support pedestal and having a frequency different from that of said RF source power generator.

16. The apparatus of claim 15 wherein said RF source power generator is a VHF generator and said RF plasma bias power generator is an HF generator.

17. The apparatus of claim 1 wherein said inner set of conductive spokes defines a circular aperture which is the inner radial termination of said inner set of conductive spokes, said post being hollow, said aperture being of sufficient radius to compensate for non-uniformity in the radial distribution of plasma ion density near the workpiece support pedestal.

18. The apparatus of claim 1 wherein the combination of said inner and outer set of spokes with said conductive enclosure having a fundamental resonant frequency inversely proportional to the height of said conductive enclosure and the lengths of said inner and outer set of conductive spokes.

19. The apparatus of claim 18 wherein a frequency RF frequency corresponding to said fundamental resonant frequency.

20. An RF power applicator for use with a plasma reactor for processing a semiconductor workpiece, said reactor comprising a chamber having a chamber ceiling, said RF power applicator comprising:
a conductive enclosure outside of the chamber and overlying the chamber ceiling and having a conductive side wall with a bottom edge supported on said chamber ceiling and a conductive ceiling supported on a top edge of said conductive side wall, and a conductive post extending parallel with said conductive side wall from a center portion of said conductive ceiling toward said chamber ceiling;
a spoke antenna array comprising:
(a) a set of inner conductive spokes extending radially outwardly from and electrically connected to said conductive post toward said conductive side wall,
(b) a set of outer conductive spokes extending radially inwardly toward said conductive post and from and electrically connected to said conductive side wall, whereby said inner and outer sets of conductive spokes are electrically connected together, the combination of said inner and outer set of spokes with said conductive enclosure having a fundamental resonant frequency inversely proportional to the height of said conductive enclosure and the lengths of said inner and outer set of conductive spokes;

an RF source power generator coupled across said spoke antenna array and having an RF frequency corresponding to said fundamental resonant frequency.

21. The apparatus of claim 20 wherein said RF power source is connected across an RF tap point on one of said spokes and said conductive enclosure.

22. The apparatus of claim 21 wherein said RF tap point is near the end of one of the inner set of spokes.

23. The apparatus of claim 20 wherein said inner set of spokes are interleaved with said outer set of spokes.

24. The apparatus of claim 23 wherein said inner and outer sets of spokes are generally co-planar.

25. The apparatus of claim 24 wherein said inner and outer sets of spokes are in a plane near the bottom edge of said conductive side wall of said conductive enclosure.

26. The apparatus of claim 20 further comprising an insulating base on the bottom of said RF power applicator.

27. The apparatus of claim 26 wherein said insulating base has a capacitance which brings a load impedance presented to said RF power source closer to the output impedance of said RF power source than it would otherwise be without said insulating base.

28. The apparatus of claim 27 further comprising a gas distribution manifold and gas distribution orifices formed in said insulating base, said orifices opening out in a bottom surface of said insulating base.

29. The apparatus of claim 27 wherein said output impedance of said RF source is 50 Ohms.

30. The apparatus 26 wherein said insulating base has a top portion defining a 3-dimensionally shaped surface, the inner and outer spokes of said RF power applicator conforming to said 3-dimensionally shaped surface.

31. The apparatus of claim 30 wherein said spokes of said RF power applicator are shaped by said 3-dimensionally shaped surface so as to render a radial distribution of plasma ion density more uniform.

32. The apparatus of claim 31 wherein said 3-dimensionally shaped surface is farther from a base plane of said RF power applicator than at its periphery.

33. The apparatus of claim 32 wherein said 3-dimensionally shaped surface corresponds to a multi-radius dome.

34. The apparatus of claim 20 wherein said fundamental resonant frequency is a VHF frequency.

35. The apparatus of claim 34 wherein the RF currents in all of the spokes of said RF power applicator are in phase at said fundamental resonant frequency.

36. The apparatus of claim 20 wherein said reactor further comprises a workpiece support pedestal in said chamber, and wherein said inner set of conductive spokes defines a circular aperture which is the inner radial termination of said inner set of conductive spokes, said post being hollow, said aperture being of sufficient radius to compensate for non-uniformity in the radial distribution of plasma ion density near the workpiece support pedestal.

37. The apparatus of claim 20 wherein said fundamental resonant frequency corresponds to a wavelength distance from the tips of the inner spokes to the tips of the outer spokes.

38. The apparatus of claim 20 wherein said conductive enclosure is cylindrical and coaxial with said inner and outer arrays of spokes.

39. A plasma reactor for processing a semiconductor workpiece, comprising:
   a reactor chamber having a chamber ceiling and a chamber side wall and a workpiece support pedestal within the chamber;
   a process gas conduit and gas distribution orifices facing the interior of the chamber and coupled to the process gas conduit;
   an RF power applicator comprising:
      (a) a set of inner conductive spokes extending radially outwardly from a center axis,
      (b) a set of outer conductive spokes extending radially inwardly from a peripheral circumference;
   an RF source power generator coupled across said RF power applicator and having an RF frequency corresponding to said fundamental resonant frequency;
      (c) an electrically conductive path between a center location of said set of inner spokes and a periphery of said outer spokes, whereby said inner and outer sets of conductive spokes are electrically connected together;
      wherein said RF power applicator is outside of said chamber and rests on said ceiling; and
      further comprising a conductive enclosure enclosing sides and top of said RF power applicator, wherein the combination of said inner and outer set of spokes with said conductive enclosure has a fundamental resonant frequency inversely proportional to an axial length of said conductive enclosure and the lengths of said inner and outer set of conductive spokes.

40. The apparatus of claim 39 wherein said conductive path comprises a cylindrical RF shielding can surrounding said inner and outer spokes.

41. The apparatus of claim 40 wherein said RF power source is connected across an RF tap point on one of said spokes and said RF shielding can.

42. The apparatus of claim 41 wherein said RF tap point is near the end of one of the inner set of spokes.

43. The apparatus of claim 39 wherein said inner set of spokes are interleaved with said outer set of spokes.

44. The apparatus of claim 43 wherein said inner and outer sets of spokes are generally co-planar.

45. The apparatus of claim 44 wherein said conductive enclosure comprises a conductive side wall and wherein said inner and outer sets of spokes are in a plane near the bottom edge of said conductive side wall of said conductive enclosure.

46. The apparatus of claim 39 further comprising an insulating base between said RF power applicator and said chamber ceiling.

47. The apparatus of claim 46 wherein said insulating base has a capacitance which brings a load impedance presented to said RF power source closer to the output impedance of said RF power source than it would otherwise be without said insulating base.

48. The apparatus of claim 47 further comprising a gas distribution manifold and gas distribution orifices formed in said insulating base, said orifices opening out in a bottom surface of said insulating base toward said workpiece support pedestal.

49. The apparatus of claim 47 wherein said output impedance of said RF source is 50 Ohms.

50. The apparatus 46 wherein said insulating base has a top portion defining a 3-dimensionally shaped surface, the inner and outer spokes of said RF power applicator conforming to said 3-dimensionally shaped surface.

51. The apparatus of claim 50 wherein said spokes of said RF power applicator are shaped by said 3-dimensionally shaped surface so as to render a radial distribution of plasma ion density more uniform.

52. The apparatus of claim 51 wherein said 3-dimensionally shaped surface is farther from said workpiece support pedestal at its center than at its periphery.

53. The apparatus of claim 52 wherein said 3-dimensionally shaped surface corresponds to a multi-radius dome.

54. The apparatus of claim 39 wherein said fundamental resonant frequency is a VHF frequency.

55. The apparatus of claim 54 wherein the RF currents in all of the spokes of said RF power applicator are in phase at said fundamental resonant frequency.

56. The apparatus of claim 39 further comprising:
   a bias RF power generator coupled to said workpiece support pedestal and having a frequency different from that of said RF source power generator.

57. The apparatus of claim 56 wherein said RF source power generator is a VHF generator and said RF bias power generator is an HF generator.

58. The apparatus of claim 39 wherein said inner set of conductive spokes defines a circular aperture which is the inner radial termination of said inner set of conductive spokes, said aperture being of sufficient radius to compensate for non-uniformity in the radial distribution of plasma ion density near the workpiece support pedestal.

59. The apparatus of claim 39 wherein said fundamental resonant frequency corresponds to a wavelength distance in an electrical path extending from the tips of the inner spokes to the tips of the outer spokes.

* * * * *